United States Patent
Bink et al.

(10) Patent No.: US 7,423,449 B2
(45) Date of Patent: Sep. 9, 2008

(54) ELECTRONIC CIRCUIT

(75) Inventors: Adrianus Josephus Bink, Eindhoven (NL); Mark Nadim Olivier De Clercq, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 53 days.

(21) Appl. No.: 10/598,573

(22) PCT Filed: Feb. 24, 2005

(86) PCT No.: PCT/IB2005/050682

§ 371 (c)(1),
(2), (4) Date: Sep. 5, 2006

(87) PCT Pub. No.: WO2005/091005

PCT Pub. Date: Sep. 29, 2005

(65) Prior Publication Data

US 2007/0208974 A1    Sep. 6, 2007

(30) Foreign Application Priority Data

Mar. 10, 2004   (EP)   .................................. 04100970

(51) Int. Cl.
*H03K 9/00*    (2006.01)
*G01R 31/28*   (2006.01)

(52) U.S. Cl. .............................. 326/16; 326/46; 326/93; 714/726

(58) Field of Classification Search .................. 326/16, 326/46, 93; 714/726, 724
See application file for complete search history.

(56) References Cited

U.S. PATENT DOCUMENTS 4,780,874 A * 10/1988 Lenoski et al. .............. 714/726

* cited by examiner

*Primary Examiner*—Daniel D Chang
(74) *Attorney, Agent, or Firm*—Larry Liberchuk

(57) ABSTRACT

An electronic circuit is provided that comprises first and second combinational logic blocks and a latch positioned between the combinational logic blocks; wherein the electronic circuit is adapted to operate in a normal mode in which the latch is opened and closed in response to an enable signal, and a test mode in which the latch is held open.

8 Claims, 2 Drawing Sheets

US 7,423,449 B2

ELECTRONIC CIRCUIT

TECHNICAL FIELD OF THE INVENTION

The present invention relates to the field of electronic circuits, and in particular to the testing of electronic circuits comprising latch-based pipelines.

BACKGROUND TO THE INVENTION

Many conventional microprocessors use 'pipelines' to increase parallelism and performance. That is, where instruction execution in a microprocessor comprises several independent steps, separate units can be created in the microprocessor to carry out each step. When a unit finishes executing an instruction, it is passed on to the next unit in the 'pipeline', and starts work on the next instruction. Therefore, although the length of time required for an entire instruction to be executed remains the same as in a non-pipelined system, as the next instruction is only one unit behind, the overall result is that the performance of the microprocessor is improved.

In asynchronous processors, the pipeline stages are generally implemented using latches. In order to allow asynchronous microprocessors to be tested, a second layer of latches is often added to each pipeline stage. These latches combine with the original latches to create master-slave pairs. The master-slave pairs can then be clocked alternately to test the microprocessor circuitry. However, the additional layer of latches needed to create the master-slave pairs increases the silicon area required to implement the microprocessor design. Furthermore, the latches that are added are often scannable latches, which allow values to be scanned in for testing purposes. These scannable latches require more silicon area than normal latches.

Another disadvantage of adding an extra layer of latches is that when the microprocessor is not running in a test mode, the data still has to go through both of the latches in each stage, thus increasing the latency of the data path and the power consumption of the processor.

One way to circumvent the use of an additional layer of latches is to use a latch of one pipeline stage in combination with the latch in the next stage to create the required master-slave pairs. However, at the time of the invention, there is no automated way to achieve this, and designers have to manually examine the design to determine which latches to combine. Furthermore, in many instances this method cannot be used, and the designer is still forced to add an additional layer of latches to allow the processor to be tested.

There is therefore a need for a testable latch-based microprocessor that overcomes these disadvantages.

SUMMARY OF THE INVENTION

According to a first aspect of the present invention, there is provided an electronic circuit comprising first and second combinational logic blocks; and a latch positioned between the combinational logic blocks; wherein the electronic circuit is adapted to operate in a normal mode in which the latch is opened and closed in response to an enable signal, and a test mode in which the latch is held open.

According to another aspect of the present invention, there is provided a method of operating an electronic circuit, the electronic circuit comprising first and second combinational logic blocks and a latch positioned between the blocks, the method comprising operating the electronic circuit in a normal mode in which the latch is opened and closed in response to an enable signal, and a test mode in which the latch is held open.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION OF THE PREFERRED EMBODIMENTS

Although the present invention will be described below with reference to a pipeline in an asynchronous microprocessor, it will be appreciated that the present invention is applicable to any type of electronic circuit having a pipeline.

Figure 1:
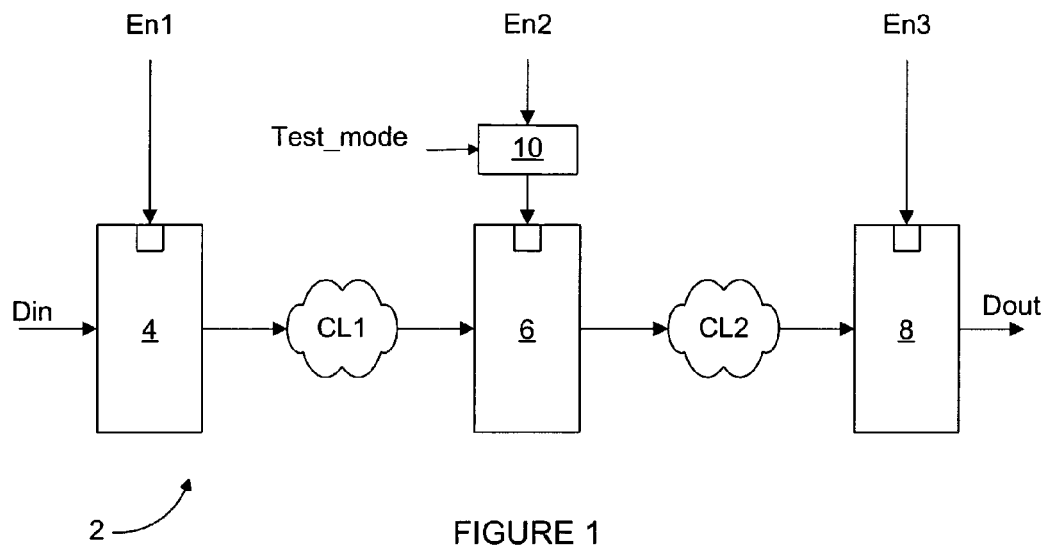
FIG. 1 shows a microprocessor pipeline according to the invention in a normal mode.

FIG. 1 shows a microprocessor pipeline according to the invention. In this illustrated embodiment, the microprocessor pipeline 2 comprises three latches or registers 4, 6 and 8, with a first combinational logic pipeline stage CL1 positioned between the first latch 4 and the second latch 6, and a second combinational logic pipeline stage CL2 positioned between the second latch 6 and the third latch 8.

As is conventional, each latch 4, 6 and 8, has a respective enable signal, En1, En2 or En3, which determines the mode of operation of the latch. When a latch is enabled (e.g. the enable signal is high) the output of the latch is the same as the input of the latch, and the latch is called transparent or open. When the latch is disabled or closed (e.g. the enable signal is low), the latch holds the last value at its input.

In a normal mode of operation, the first latch 4 stores data received at its input, Din, and passes the data to the first combinational logic pipeline stage CL1. The output of the first combinational logic pipeline stage provides the input of the second latch 6. The second latch 6 stores this output and passes it to the second combinational logic pipeline stage CL2. The output of the second combinational logic pipeline stage provides the output for the pipeline 2, Dout, via the third latch 8.

Conventionally, to test this pipeline, it would be necessary to scan values into the first and second latches to test the first and second combinational logic blocks CL1 and CL2 separately.

However, in accordance with the invention, a microprocessor pipeline is provided with a test mode in which the combinational logic stages of the pipeline can be tested as a single combinational logic block. When operating in the test mode the intermediate pipeline latches are held transparent or open. As a result, the latch of the first stage can be clocked to insert a new instruction into the microprocessor and this instruction propagates through the other pipeline stages. Thus the pipeline can be tested as if it was a single combinational logic block, and there is no need to scan values into intermediate latches to test the combinational logic blocks separately.

To allow testing of a pipeline in accordance with the invention, latch control circuits are provided to control the operation of the intermediate latches. The intermediate latches are those latches that are located between two combinational logic stages.

Therefore, in the pipeline shown in FIG. 1, the second latch 6 is an intermediate latch as it is located between the first and second combinational block stages CL1 and CL2. A latch control circuit 10 is provided to control the operation of the second latch 6. The latch controller 10 receives a Test_mode signal and the respective enable signal, En2.

Figure 2:
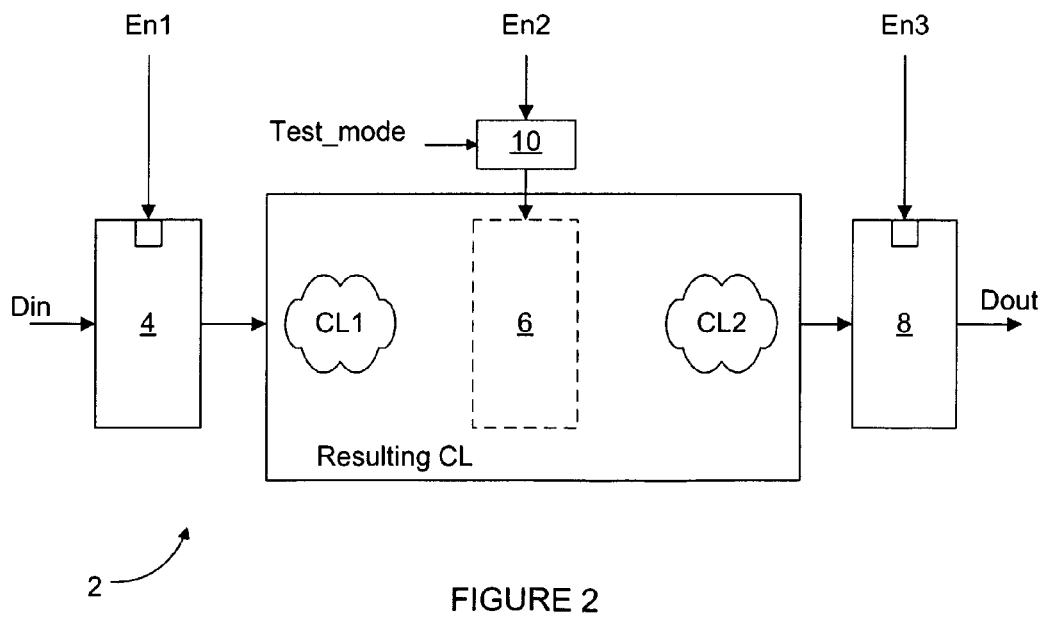
FIG. 2 shows a microprocessor pipeline according to the invention in a test mode.

When the pipeline 2 is operating in a normal mode, the operating mode of the latch 6 (i.e. transparent or holding the last value) is controlled by the enable signal En2. However, when the pipeline 2 is operating in a test mode, as shown in FIG. 2, the latch controller 10 overrides the enable signal En2 and controls the latch 6 so that it is transparent. The transparency of the second latch 6 means that data inserted into the pipeline 2 at the first latch 4 will pass through the pipeline 2 as though the first and second combinational logic pipeline stages CL1 and CL2 are a single combinational logic block (Resulting CL). The output of the single combinational logic block is then latched in the third stage 8 for observation.

It will be appreciated that an actual microprocessor pipeline may comprise more than two combinational logic pipeline stages. In this case, there will be more than one intermediate latch, and each of these intermediate latches may have a latch controller in accordance with the invention. In a test mode, each of the intermediate latches may be controlled so that data propagates through the combinational logic pipeline stages as though they form a single logic block.

A pipeline 2 in which one or more intermediate latches are held open, or transparent, is known as a reduced pipeline.

Figure 3:
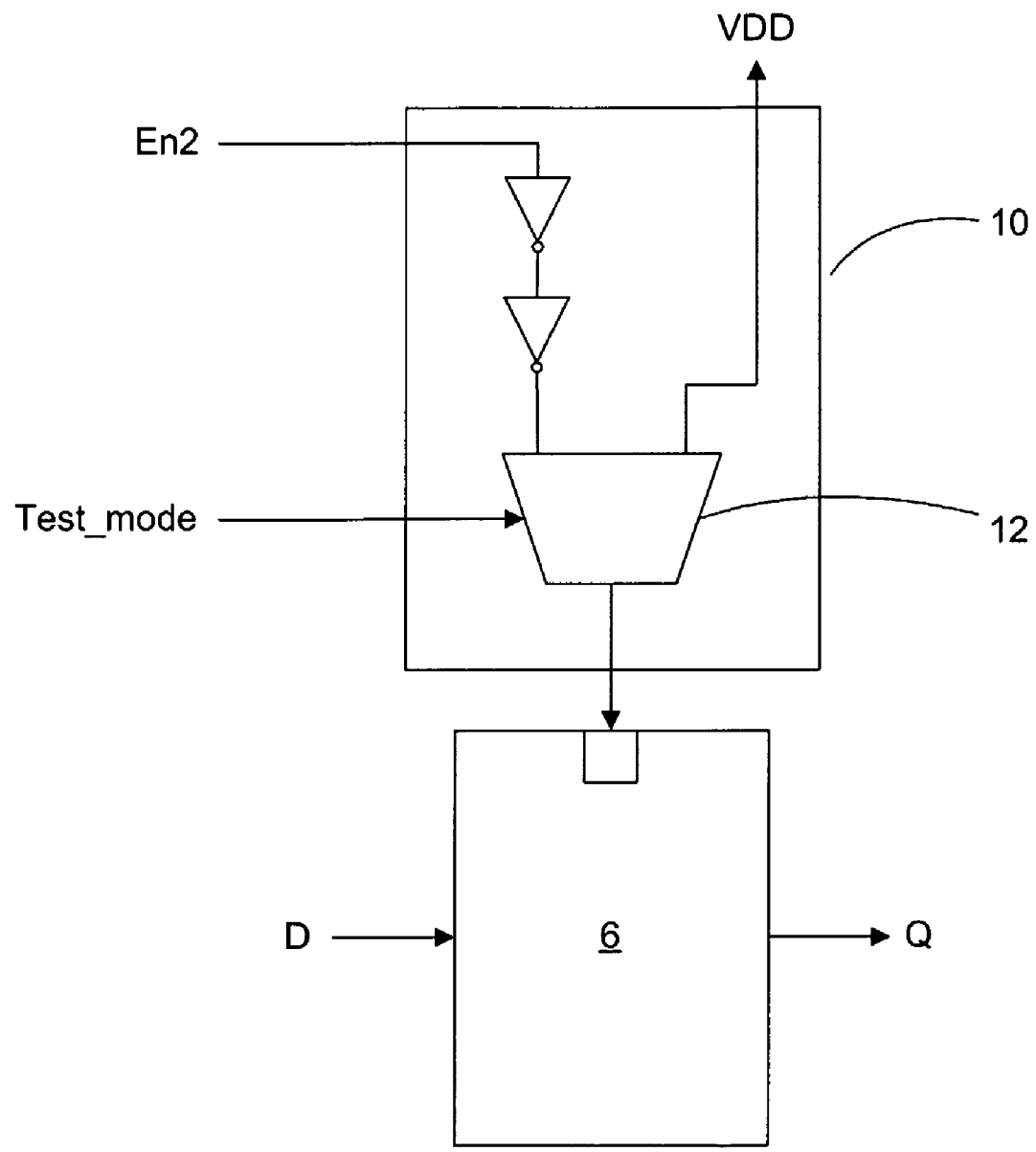
FIG. 3 shows one implementation of a pipeline latch controller according to the invention.

One implementation of a pipeline latch control circuit is shown in FIG. 3. The latch control circuit 10 determines the mode of operation of the latch 6. Specifically, the latch control circuit 10 switches the second latch 6 between a normal latching mode (in which the latch 6 is controlled by the enable signal En2) and a reduced mode where the second latch 6 is kept transparent.

In this Figure, a high value of the enabling signal is translated into the latch 6 becoming transparent. However, the adaptation of this control circuit to the opposite situation, in which a low value of the enabling signal makes the latch transparent, will be readily apparent to a person skilled in the art.

In the latch control circuit 10, the switching between a test (reduced) mode and a normal mode is determined by the Test_mode signal. This Test_mode signal controls the operation of a multiplexer 12, which has the enable signal En2 and a supply voltage signal VDD as its inputs.

If the microprocessor 2 is pushed into test mode, the multiplexer 12 will be controlled by the Test_mode signal so that the VDD signal controls the operation of the latch 6. Therefore, the latch 6 will be forced into a transparent state, regardless of the value of the enable signal En2. When a test mode is not required, the Test_mode signal controls the multiplexer 12 so that the enable signal is passed to the latch 6.

It will be appreciated that the latch control circuit described above and shown in FIG. 3 is exemplary and is merely one of many possible latch control circuits that may be used to implement the present invention. Many alternative types of latch control circuit will be readily apparent to a person skilled in the art.

Therefore, a latch with such a controller can be switched into a transparent mode whilst the other latches in the system can keep latching normally in response to the enable signal.

To test the intermediate latches themselves (as opposed to the combinational logic stages) straightforward functional testing can be used.

By using a pipeline as described above, there is no need to use a second layer of latches to form master-slave latch pairs to test the pipeline, and therefore the silicon area required by the microprocessor is reduced. Furthermore, when the processor is running in a normal mode, the data only has to go through a single latch instead of two (ie the master-slave latch pair), thereby reducing the latency of the data path and, at the same time, the power consumption of the chip.

There is therefore provided a testable latch-based microprocessor that overcomes the disadvantages associated with prior art microprocessors.

It should be noted that the above-mentioned embodiments illustrate rather than limit the invention, and that those skilled in the art will be able to design many alternative embodiments without departing from the scope of the appended claims. The word 'comprising' does not exclude the presence of elements or steps other than those listed in a claim.

The invention claimed is:

1. An electronic circuit comprising:
   first and second combinational logic blocks; and
   a latch positioned between the combinational logic blocks;
   wherein the electronic circuit is adapted to operate in a normal mode in which the latch is opened and closed in response to an enable signal, and a test mode in which the latch is held open, such that the latch is transparent.

2. An electronic circuit as claimed in claim 1, further comprising a latch control circuit connected to the latch, the latch control circuit being adapted to control the latch with the enable signal when the electronic circuit is in the normal mode, and to hold the latch open when the electronic circuit is in the test mode.

3. An electronic circuit as claimed in claim 2, wherein the latch control circuit receives a signal indicating the mode of operation of the electronic circuit.

4. An electronic circuit as claimed in claim 1, further comprising means for inserting test data into the first combinational logic block when the electronic circuit is in the test mode; the test data being processed by the first and second combinational logic blocks as though they are a single combinational logic block.

5. An electronic circuit as claimed in claim 4, further comprising means for reading the processed test data from the second combinational logic block when the electronic circuit is in the test mode.

6. An electronic circuit as claimed in claim 1, further comprising latching circuitry for inserting test data into the first combinational logic block when the electronic circuit is in the test mode; the test data being processed by the first and second combinational logic blocks as though they are a single combinational logic block.

7. A method of operating an electronic circuit, the electronic circuit comprising first and second combinational logic blocks and a latch positioned between the blocks, the method comprising:
   operating the electronic circuit in a normal mode in which the latch is opened and closed in response to an enable signal, and a test mode in which the latch is held open, such that the latch is transparent.

8. A method as claimed in claim 7, further comprising the steps of:
   inserting test data into the first combinational logic block when the electronic circuit is in the test mode; and
   retrieving processed test data from the second combinational logic block;
   wherein the test data is processed by the first and second combinational logic blocks as though they are a single combinational logic block.

* * * * *